United States Patent [19]
Chadwick et al.

[11] 3,745,095
[45] July 10, 1973

[54] PROCESS OF MAKING A METAL CORE PRINTED CIRCUIT BOARD

[75] Inventors: Donald H. Chadwick, Tulsa, Okla.; William A. Mueller, Pasadena; Ruben T. Apodaca, Norwalk, both of Calif.

[73] Assignee: International Electronic Research Corporation, Burbank, Calif.

[22] Filed: Jan. 26, 1971

[21] Appl. No.: 109,916

[52] U.S. Cl. .................. 204/15, 117/47 A, 117/212
[51] Int. Cl. .................. C23b 5/48
[58] Field of Search .................. 204/15; 174/68.5; 117/212, 47 A

[56] References Cited

UNITED STATES PATENTS

| | | | |
|---|---|---|---|
| 3,296,099 | 1/1967 | Dinella | 204/15 |
| 3,514,538 | 5/1970 | Chadwick et al. | 204/15 |
| 3,558,441 | 1/1971 | Chadwick et al. | 204/15 |
| 2,848,359 | 8/1958 | Talmy | 117/212 |
| 3,466,232 | 9/1969 | Francis | 204/30 |
| 3,579,428 | 5/1971 | Kuroda et al. | 204/30 |

OTHER PUBLICATIONS

Plating on Plastics, CC Weekly "Plating" January, 1966, pgs. 107–109.

*Primary Examiner*—John H. Mack
*Assistant Examiner*—T. Tufariello
*Attorney*—Beehler, Arant & Jagger

[57] ABSTRACT

The invention is a method for making a metal core printed circuit board which includes applying multiple layers of synthetic plastic resin material to a sheet of metal, then treating the surface of the plastic material in such a way as to provide an acceptable bond, followed by applying sundry layers of different metals, first to the plastic surface and then one upon another followed by the imposition of a circuit pattern, the removal of materials from areas intermediate the circuit pattern, and the application of an appropriate overlay of unlike metal to the circuit pattern, thereby to provide a finished circuit board.

22 Claims, 14 Drawing Figures

Patented July 10, 1973

3,745,095

4 Sheets-Sheet 1

Patented July 10, 1973 3,745,095

4 Sheets-Sheet 3

PROCESS OF MAKING A METAL CORE PRINTED CIRCUIT BOARD

This application is related to copending applications Ser. No. 772,517, filed Nov. 1, 1968 and now U.S. Pat. No. 3,558,441, Ser. No. 865,695, filed Oct. 13, 1969 and Ser. No. 772,672 filed Nov. 1, 1968 and now U.S. Pat. No. 3,514,538.

Due to the fact that printed circuits are necessarily electrically conducting metallic lines applied to some appropriate surface, the surface upon which such lines are placed must be electrically nonconducting.

Heretofore the practice almost universally prevalent has been to make use of a board or sheet which itself is of nonconducting material, to prepare the surface of that material for application of other materials; and then to build up on the surface a sufficeint thickness of metal throughout the circuit pattern to provide a mechanically stable circuit, followed by removal of a resist from those portions intermediate the circuit pattern, prior to etching away surplus metallic layers from the surface of the sheet to leave only the circuit pattern.

Although circuit boards possessed of a core comprising a sheet of naturally electrically nonconducting material have been widely used and have been highly effective, they lack the desirable property of being capable of quickly and effectively dissipating heat which is generated by components in the circuit when the apparatus in which they are used is operated. This situation has progressively become more critical as circuits and components have become smaller, especially those of micro-minature size, in that compaction of the components and circuits into increasingly smaller spaces diminishes the amount of space available around them for the circulation of cooling air whereby to keep the temperature of the electrical apparatus when operating at a desirable minimum.

In recent years some developers have undertaken to make use of metal cores for circuit boards. Typical developments have materialized in the issue of certain patents among which are: U.S. Pat. Nos. to Eisler 2,706,697; Gellert 3,165,672; Dinella 3,296,099.

Although the developments mentioned have undertaken to make use of some form of dielectric material for coating the surfaces of the metallic sheet or core, dielectric materials which heretofore have been made use of have been hard to handle, difficult to apply in a manner assuring an adequate bond and hard to prepare in such fashion that the electric circuit pattern, once applied to them will be durable as well as precisely dependable, to the degree required by complex electronic circuitry. The high expense of adequately treating a metallic board to accept a satisfactory circuit pattern has been an additional deterring factor. Other difficulties have been experienced when the metallic sheet has been drilled and fabricated, as for example, insulating the walls of holes drilled through the metallic sheet sufficient to avoid short-circuiting of electric leads from electric components passed through the board.

A still further obstacle to the design of a metal core printed circuit board has been the difficulty of having components in close enough contact with the circuit board so that heat generated in the components can pass readily to the metal core, serving in such instances as a heat sink, and at the same time have the component adequately insulated electrically from the electrically conducting metal core.

It is therefore an object of the invention to provide a new and improved method of making a metal core printed circuit board which is provided with an especially adequate layer of electrically insulating but thermally conducting coating of such character that a circuit pattern can be applied to the coating in a dependable fashion whereby to result in a finished circuit board of precision character and capable of long life.

Still another object of the invention is to provide a new and improved method for making of a metal core printed circuit board which permits the application to the metal surface of a synthetic plastic resin material in multiple films and the treating and handling of the resin in such fashion that it will be tough and durable where left exposed, providing adequate electrically insulating properties, but which also can be kept thin enough in over-all thickness to pass heat, generated by components in the circuit, readily through the resin to the metal core to be carried away by conduction as the primary mode of heat transfer, notwithstanding the benefits of radiation and convection modes.

Still another object of the invention is to provide a new and improved method for making a metal core printed circuit board which makes use of a special preparation of the resin surface and provides a special technique for bonding an initial metallic layer to the resin surface so that a hard, fast, durable and permanent bond will be achieved.

With these and other objects in view, the invention consists in the construction, arrangement, and combination of the various phases of the method, whereby the objects contemplated are attained, as hereinafter set forth, pointed out in the appended claims and illustrated in the accompanying drawings.

Figures 1, 2, 3, 13:
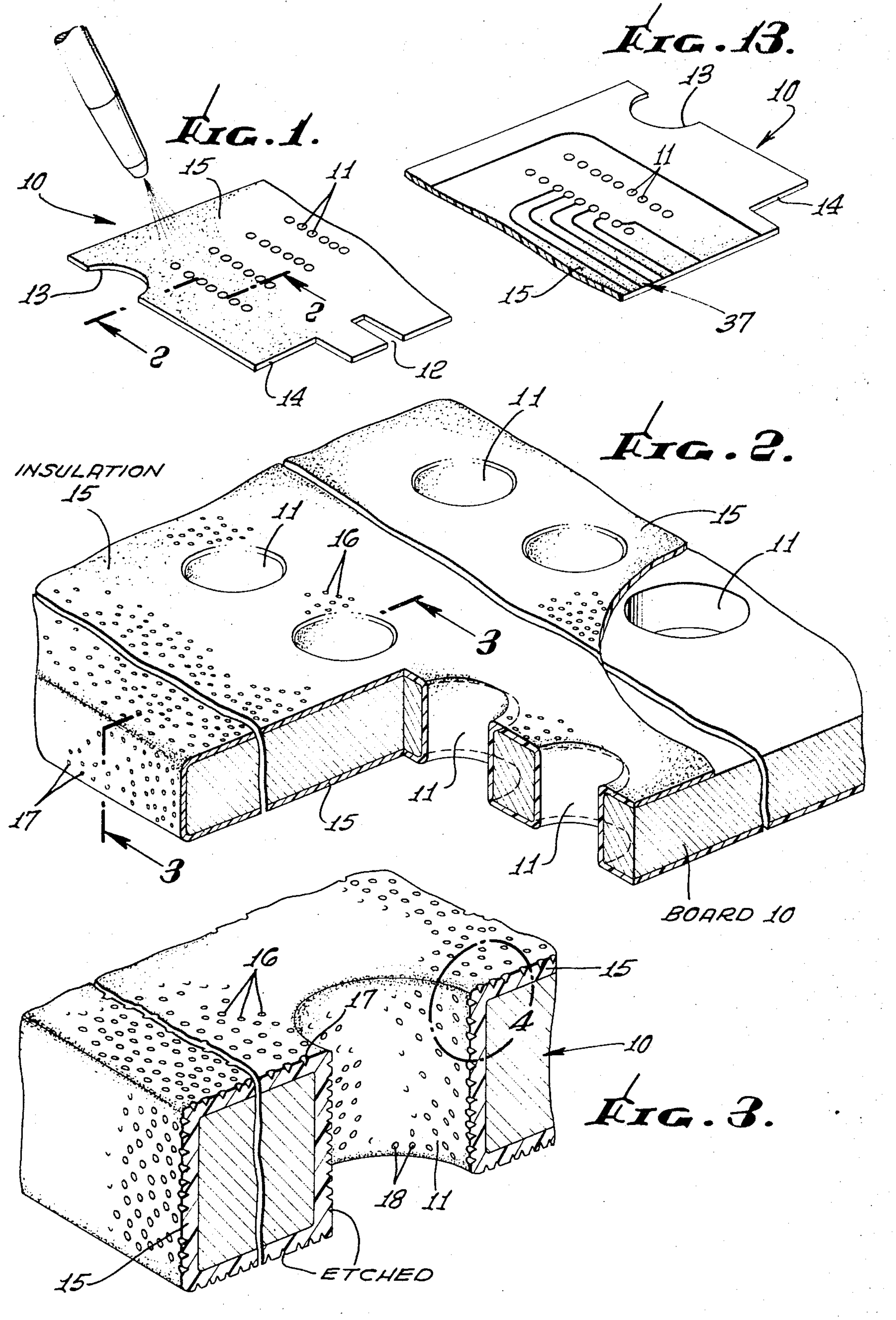
FIG. 1 is a fragmentary perspective view of a metal core subsequent to drilling and machining.
FIG. 2 is a fragmentary perspective view on line 2—2 of FIG. 1 partially broken away showing the metal core after application thereto of an insulating coating.
FIG. 3 is a fragmentary perspective view on the line 3—3 of FIG. 2, after the step of chemical treatment.
FIG. 13 is a fragmentary perspective view of a finished circuit board.

In an embodiment of the invention chosen for the purpose of illustration, there will be described a metal core printed circuit board which has an electrically conducting printed circuit pattern on both sides of the board, the circuit pattern being interconnected by means of conducting metal extending through holes in the board. It will be understood, however, that the process is readily applicable to a single surface where a single circuit pattern on one side is sufficient with or without holes.

Customarily, the thickness of a printed circuit board is assumed to be the over-all finished thickness of the composite board, after the circuit pattern has been applied. For that reason the sheet of material, which in this instance is a metal sheet, is made slightly smaller than the expected finished thickness to allow a build-up of lines on one or both sides which will ultimately determine the finished thickness. Quite commonly, a finished printed circuit board is one which is 1/32 of an inch thick. Other thicknesses are prevalent, however, but irrespective of the relative thickness of the finished board, the process herein described of preparing it and applying to it an electrically conductive circuit is substantially the same.

In the chosen embodiment, where the finished board is to be 1/32 inch thick, the initial metal sheet should be approximately 0.025 inch thick to allow for the build-up of the sundry layers of material. Other sheets may be double, triple or even four times as thick as actual practice or may be thinner. Board thickness of less than 0.025 inch can be processed. The limiting factor is hole size to board thickness ratio. Processing has been limited to a finished hole of 0.020 inch and a 0.025 inch thick substrate. The nature of the electrically nonconducting coating application is such that hole diameters greater than 0.020 inch would allow thinner substrates to be used.

The metal sheet is preferably of aluminum because of its toughness, its thermal conducting ability, and other physical attributes which make it readily workable. Other kinds of metal however will also serve. A metal sheet 10 is initially trimmed to size and then drilled so as to provide the holes 11 which will be needed to interconnect circuit patterns on opposite sides of the sheet and also to permit the wire leads from electric components mounted on one side of the board to be extended through the board and electrically connected to a circuit pattern on the opposite side. In the sheet 10 only some of the holes 11 are shown and it should be understood that the precise location of the holes is coded so that when the printed circuit pattern is ultimately applied, it will encompass the holes in their initially drilled position.

It is also desirable to fabricate the sheet before any succeeding step is undertaken. This means deburring the holes 11 previously referred to and also preparing any other slots, cuts or sundry confugurations, like for example the slot 12, the cutout portion 13 and the cutoff corner 14. These cutout portions are referred to merely by way of example, since each different circuit board will in all expectation be individually tailored to fit the cabinet in which it will be ultimately used.

Following fabrication, the sheet is etched in a caustic solution and then anodized. Anodizing amounts to a chemical surface treatment, the object being to make use of a treatment which will chemically clean the surface upon which subsequent applications of materials are to be made. Anodizing is a suitable surface preparation for aluminum. Chemical conversion coatings such as the various chromate conversion films, such as Iridite, are suitable. Other metals such as copper, copper alloys, titanium, steel, magnesium, lithium-magnesium alloys or other base metals or alloys would require other or similar surface preparations to provide a receptive surface to promote coating adhesion to the metal substrate.

The sheet is now ready for application of an electrically nonconducting coating 15 which, in the present instance, is a coating of such character as to be capable of offering relatively a minimum amount of resistance to the transfer of heat to the sheet. In the chosen example, both sides of the sheet 10 are coated whereby to provide for the application of a circuit pattern to both sides. Initially a primer is applied to both sides or surfaces of the sheet 10 and over the primer are applied one or a multiple number of successive, relatively thin coats of a synthetic plastic resin material containing an appropriate hardener, the consistency of which is thin enough so that each successive coat will be a very thin coat. While the actual number of successive coats of the synthetic plastic resin material is not critical, it has been found in practice that there should not be less than three coats and that as many as ten coats may be found desirable to achieve the needed physical, electrically nonconductive and thermally conductive properties which will be needed in the finished printed circuit board of the quality sought. It will be understood that the same multiple coats of synthetic plastic resin material will also be applied to the walls of the holes 11 which have been drilled through the board. A synthetic plastic resin material which is especially advantageous is polyurethane resin and a primer of desirable characteristics is a catalyzed primer such as is described in MIL-P-15328B or MIL-P-14504A. Other resins having desirable characteristics are epoxy resin, polyimide, diallylphthalate, polyester, polyurea, melamine-formaldehyde and silicone resin. A resin heavily filled with an appropriate filler or pigment is effective, acceptable fillers being metal oxides such as aluminum oxide or beryllium oxide, and similar inorganic oxides or salts designed to enhance thermal conductivity while retaining electrical insulation.

After the one or more layers of resin have been built up, the composite sheet, coated as described, is stabilized. Stabilization in the present instance contemplates heat curing at temperatures of from 150° to 220° C for a period of about 72 hours. Curing as described stabilizes the resin and also makes it appreciably dense. In practice, it has been found that a curing such as that herein recommended produces a coating layer, the ultimate thickness of which is about 50 percent to 60 percent of the thickness when initially applied.

Since the synthetic plastic resin is depended upon to electrically insulate the metal core or sheet of metal material from the metallic lines of the circuit pattern and also to provide a base upon which the circuit pattern is to be built, it will be appreciated that the coating of the resin material must be durable and must also be one which will be compatible to a build-up of materials on it in such a manner that the materials when built upon it will be mechanically stable and not readily damaged or removed.

A multiple step procedure is found advantageous to prepare the surface of the synthetic plastic resin for the process.

The board is thoroughly cleaned, as for example, by spray rinse or mechanical scrubbing, followed by application of an alkaline cleaner to remove any possible oils or greases which may have accumulated on the surface, followed by a clear water rinse.

Figures 4, 4A, 5:
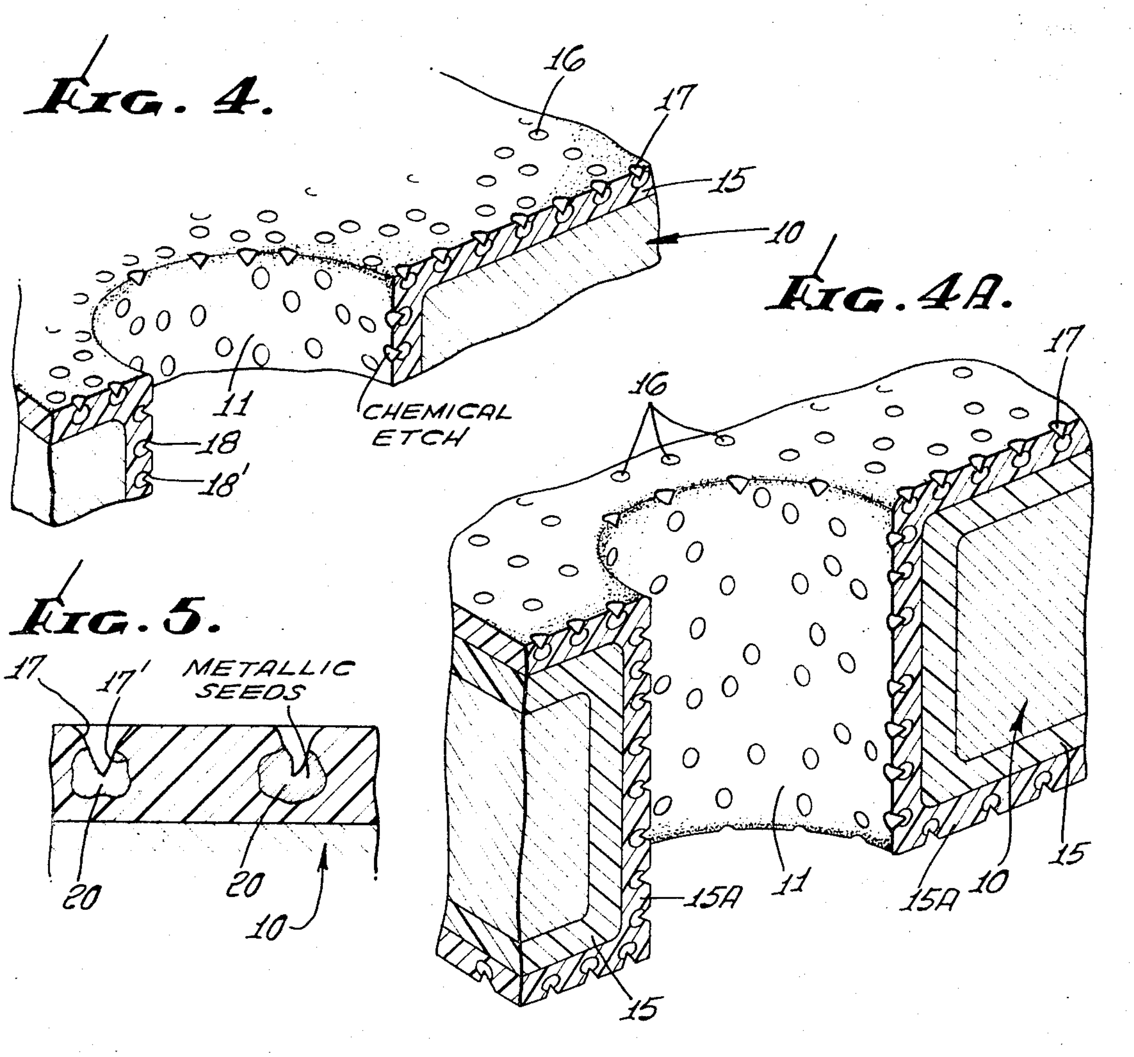
FIG. 4 is a fragmentary perspective view on the line 4—4 of FIG. 3 showing the condition of the insulating coating after the chemical etch.
FIG. 4A is a fragmentary perspective view similar to FIG. 4 but showing the succession of layers when an overcoat of insulating material is used.
FIG. 5 is a fragmentary cross-sectional view of the coating in a condition of the step following FIG. 4.
Figure 6:
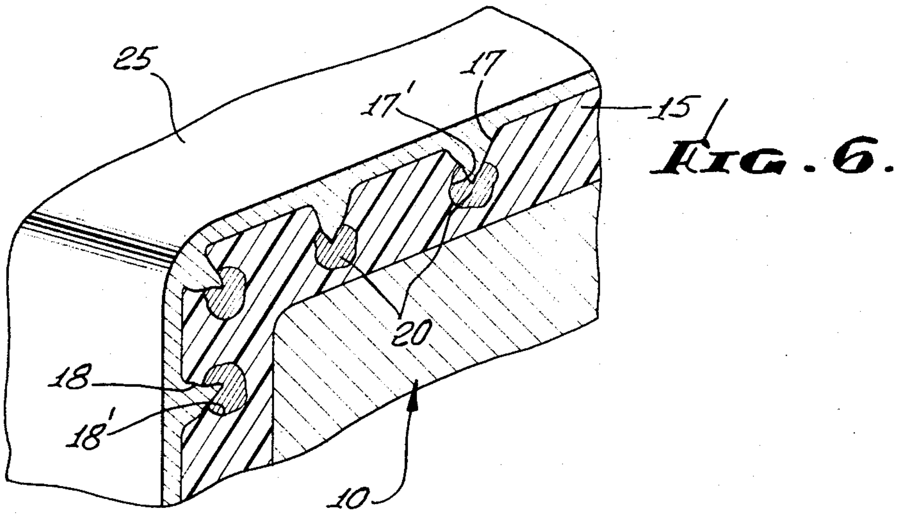
FIG. 6 is a fragmentary cross-sectional view showing the insulating coating after application of the first conductive layer is complete.

Over the outermost layer may then be applied a top coat of modified fast setting synthetic resin as shown in FIG. 4A. An acceptable thickness is one of about 0.003 inches. The steps of treating the surface coating are the same, whether the special overcoat is used as the last layer of insulating material or the last layer is of the same material of the layers underneath.

The next step is to render the substrate conductive in order that a desired circuit pattern may be electroplated on its surface. This may be done by a number of techniques, such as vacuum metallization, coating with conductive lacquers, plasma spraying or electroless deposition.

In the embodiment described herein the surface is subjected to controlled degradation by chemical attack. An acceptable chemical is a caustic permanganate such as potassium permanganate/sodium hydroxide capable of eating into the resin material for a portion of its depth. Another acceptable chemical is a chromic type mixture in solution.

When the chemical treatment above described is employed, the board is then subjected to an acid rinse to remove all etchant, cleaned and neutralized.

It is theorized that the chemical degrading step forms pits in the bottoms of the pockets 16, 17, 18, etc. as shown by the reference characters 17', 18' etc. so that they are more capable of retaining materials which may be deposited into them and so that they will provide a keying effect of a material build-up. In practice, the surface of the resin is normally nonwettable and the degrading step hereinabove is for the purpose of making it temporarily wettable for application of subsequently applied materials.

The surface is then sensitized, by which is meant that the surface is rendered catalytic towards subsequent deposition of the thin conductive metal film from a suitable electroless metal bath. Sensitizing in the present disclosure may include subjecting the coated board to a bath of metal salts, namely, metallic salts in which agents are present to cause the metal from the salts, that is to say pure metal, to deposit on the surface and theoretically to deposit in the pockets 17', 18' etc. which were created by the degrading step. The effect of sensitizing as described is believed to cause tiny seeds 20 of pure metal to accumulate in the pockets created initially and subsequently enlarged. Colloidal dispersions of the metal may also be used.

A satisfactory metal is a "noble" metal of which palladium, in the form of palladium chloride, is an acceptable example. This is a solution having a pH of from 0.01 to 5 for example. Palladium is one of the more stable and long lasting of the noble metal salts. Although in fact expensive, such a relatively small quantity is needed to sensitize a composite coated sheet of the kind described that the relatively high cost of the metal is not a determining factor.

Following the deposit of the noble metal as a catalyst, build-up of layers or films of materials on the surface of the resin commences. The foregoing step is followed by an electroless metal deposit such as nickel or copper. This means subjecting the treated surface to an electroless metal bath to build up thickness sufficient for electrical conductivity, namely, a layer 25, followed by a heating period of about 1 hour at 110° C, an alkaline cleanse and an acid activation.

The layer of metal 25 is from about 10 to about 50 millionths of an inch thick.

The succeeding step is an electroplating step wherein a second layer 27 of metal, preferably copper, of about 0.0001 inch thickness is electroplated to the electroless metal. This layer of metal is commonly referred to as a strike and provides a basis for subsequent handling and electroplating.

Copper is then plated on the strike metal by electroplating at about 25ASF in a pyrophosphate copper solution long enough to build up the required thickness of copper plating, for example 0.001 to 0.003 inches. The thicker built up copper layer is identified by the reference character 29. Following the copper build-up the board is cleaned with pure water and by physically scrubbing the board with a mild abrasive, followed then by a spray rinse.

If the initially described steps were temporarily suspended and the product stored in the meantime resulting in the forming of oxides, the board is first recleaned by scrubbing the board with a mild abrasive, then spray rinsed, acid dipped, again spray rinsed, deoxidized, spray rinsed, and air blasted dry, or in other words, cleaned and deoxidized.

The imposition of metal plated layers may be discontinued at this point in which event the topmost layer will be the copper layer 29 applied to a desired thickness.

A resist material 36 that is impervious to all subsequent process solutions is then applied over the cleaned copper surface in specific areas where the circuitry is desired. It is desirable at this stage to dry the product at about 220° F for from a few minutes to an hour.

Typical standard resists are those developed by the silk screening process or the photo emulsion types, such as Eastman Kodak "KPR" (wet), or DuPont "Riston" (dry). In any event, the circuitry is imposed onto the resist by means of a photo negative through standard printed circuit board photographic techniques.

What has been described thus far for the application of resist to the surface takes place in the same way at each hole location. Depending upon the type of resist used, the hole will either be coated through KPR silk screen or bridged by Riston.

Figures 7, 8:
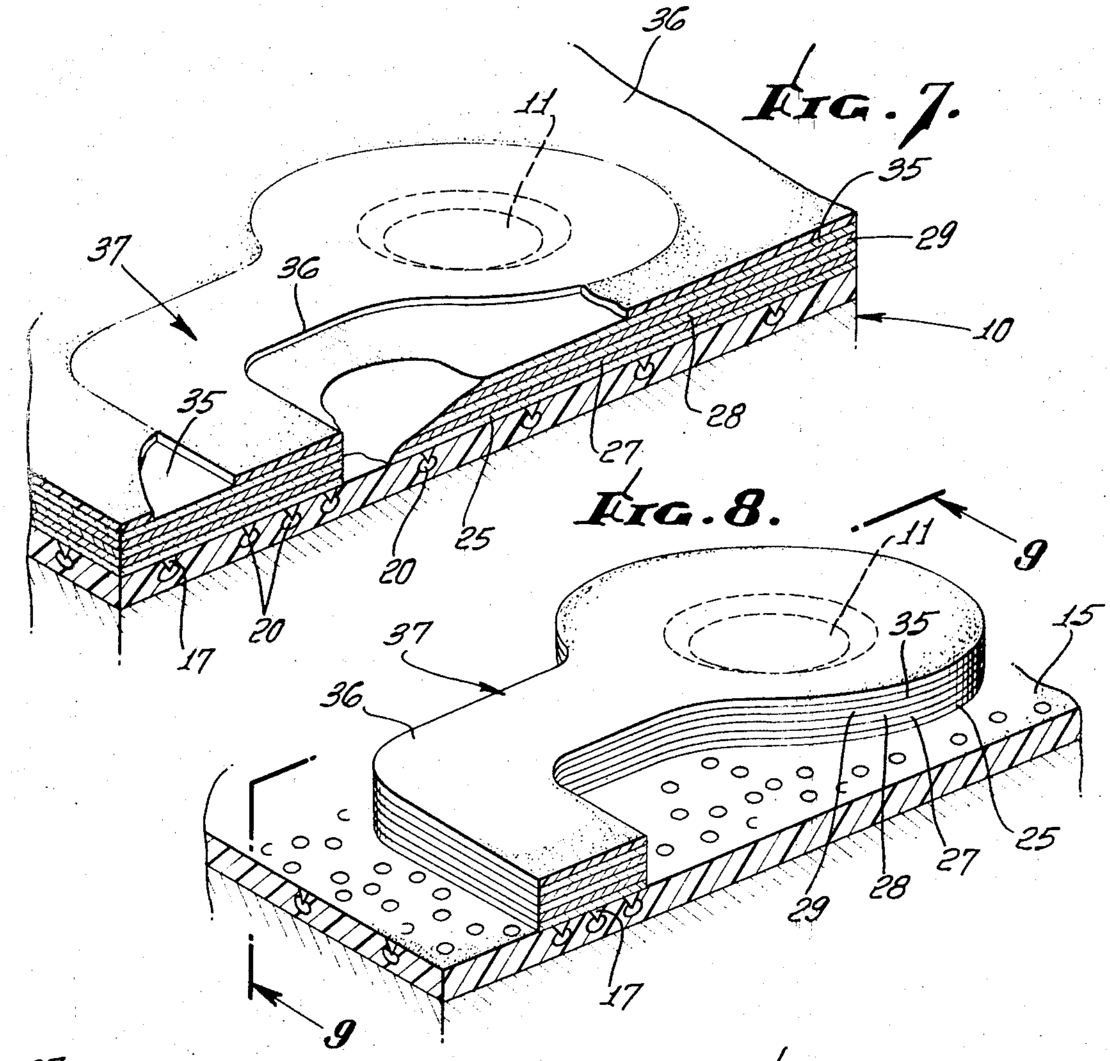
FIG. 7 is a perspective view partially in section showing the condition of the board after initial build-up of all of the layers of material.
FIG. 8 is a perspective view partially in section similar to FIG. 7 illustrating the step following that shown in FIG. 7.
Figure 9:
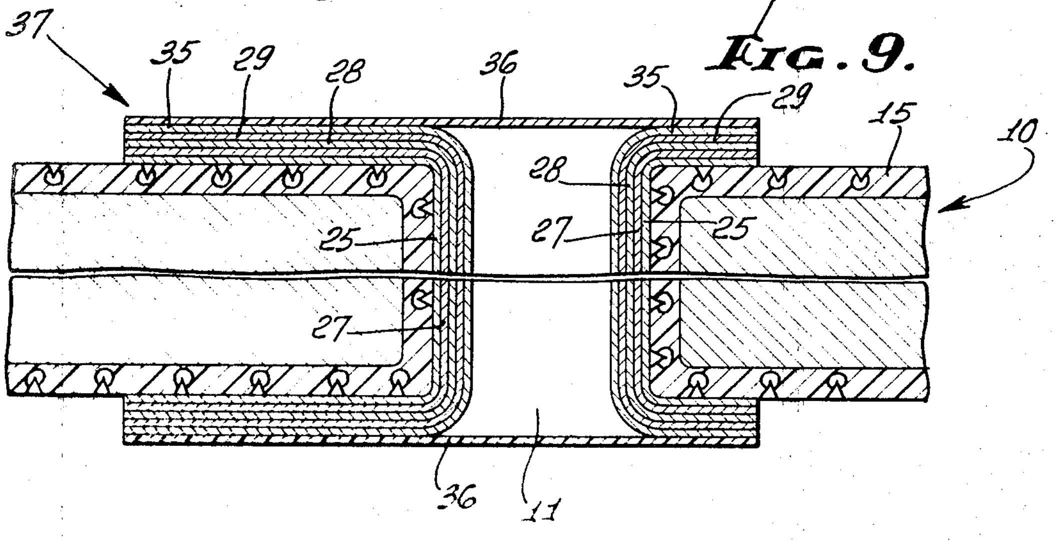
FIG. 9 is a perspective view partially in section similar to FIG. 8 wherein the build-up of the line of the circuit pattern has been completed and extends through one of the holes.
Figures 10, 11, 12:
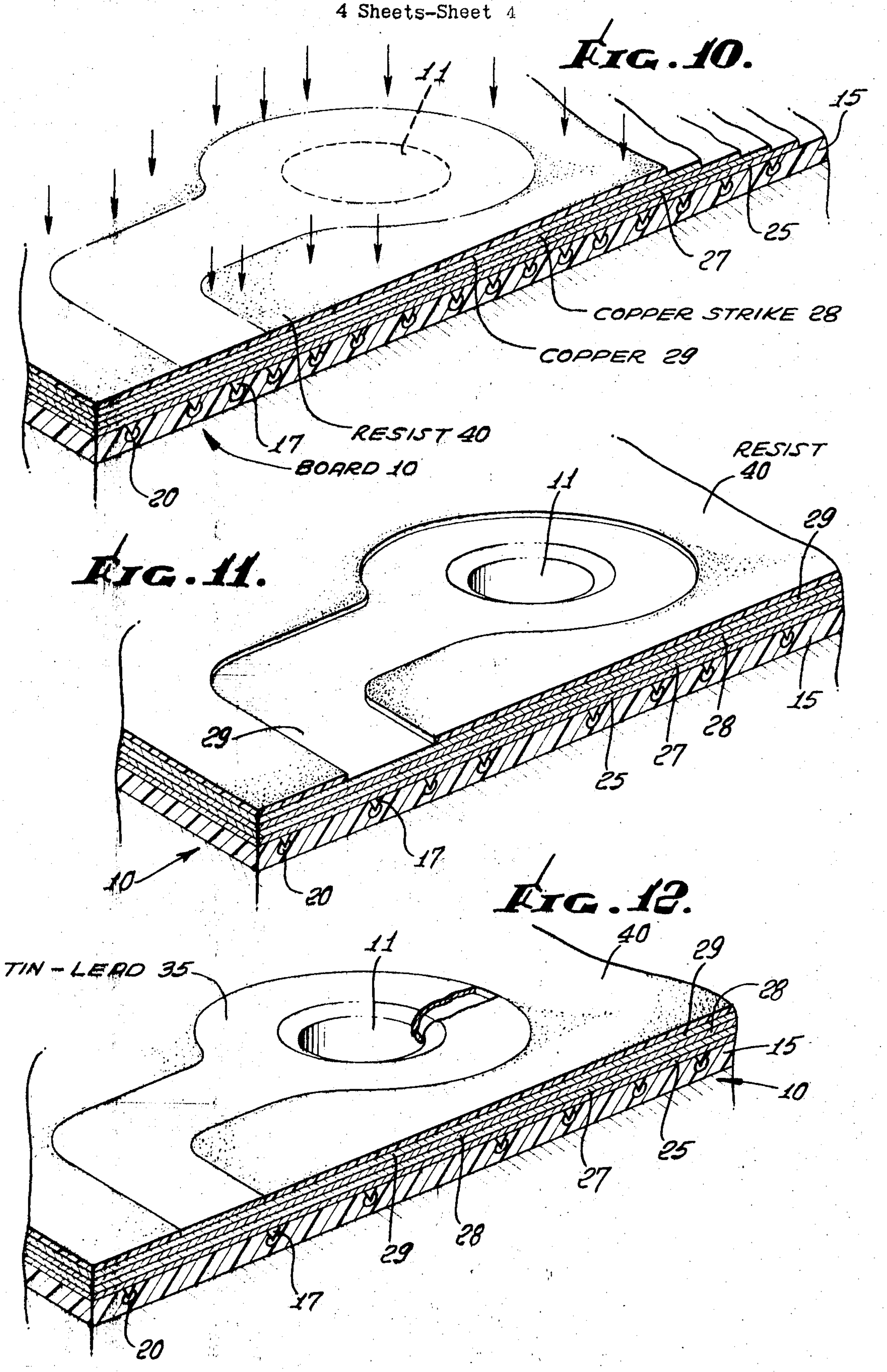
FIG. 10 is a perspective view partially in section similar to FIG. 7 but wherein a different method is employed for applying the circuit pattern.
FIGS. 11 and 12 are perspective views partially in section similar to FIG. 10 but showing respective successive steps in the production of the circuit pattern.

Prior to etching away all of the metal layers in the intermediate non-circuit area, the resist, if present, must be removed. When this has been performed, the copper and nickel layers may be etched away with a 3-minute dwell time in a ferric chloride etchant heated to 100° F. as shown in FIGS. 8 and 9. The exposed synthetic plastic resin is then acid dipped, scrubbed with a power brush mild abrasive, spray rinsed, acid dipped, and air blasted dry.

When required, an overplating 35 such as tin, tin-lead solder, or nickel may be applied over the cooper plate. In this case, the resist will then be applied to the overplating instead of to the copper plate.

An overplate commonly used in this process is 60/40 tin-lead solder plate applied at about 25 ASF to a thickness of about 0.0003 to 0.0005 inch.

If an overplating such as 60/40 tin-lead solder alloy is used, the ferric chloride etch is preceeded by one in a fluoboric acid/30 percent hydrogen peroxide type etchant. The actual dwell time will be dependent upon the specific commercial brand used.

The etching steps described above are not essentially specific to this invention, and any standard etchant (ammonium persulfate, chromic-sulfuric acid etc.) may be readily substituted.

The resist over the circuit pattern 37 is then removed by employment of a substantially conventional resist stripper thereby to bare the surface of the copper layer 29 which heretofore has been located beneath the resist. If an overplating has been applied, the overplating will be exposed instead of the copper layer 29. The surface is then cleaned by spray rinse, for example, to be sure that all resist is completely removed.

Over the copper surface there may be electroplated a 60/40 tin-lead plate 35 to a thickness of 0.0003 to 0.0005 inch, which can be accomplished by using a current of 20 amps. per square foot for about 5 minutes, as shown in FIGS. 7 and 8. After application the tin-lead is cleaned with a mild abrasive, whereafter the resist 36 is applied, followed by the succeeding steps above described.

In the foregoing description the process described is one that is generally defined as panel plating. However, it should be understood that this method can be varied by merely building up plating layers within the precise confines of the circuitry itself. This process variation is generally referred to as pattern plating. It differs from the basic process described herein only in the manner and sequence that the resist is exposed and applied. In this case the resist is exposed with a photopositive. All intermediate circuit areas remain resisted and the circuitry is bared to whatever basic metal is deemed satisfactory to start a plating build-up. FIGS. 10, 11, 12 and 13 depict a sequence of pattern plating superimposed, for example, on layers 25 and 27 when those layers are nickel. The pattern plating begins with copper plate as the basic metal to which a 60/40 tin-lead solder plate is then overplated only onto the exposed circuitry. Variations to this sequence are many, to wit: electroless nickel plate, sulfamated nickel plate, or the copper strike may be used as the basic metal and tin, gold, nickel or rhodium may be used as the overplating for both the first described panel plating form of the method and the last described pattern plating form. Finally, the overplating may be used as the resist in specific etchants or the exposed circuitry may be re-resisted and etched in the ferric chloride as previously described. The composite substrate, or printed wiring board a this point is then subjected to a bake at about 350° F for a period of from about 15 minutes to about 1 hour until the surface portion of te electrically non-conducting material is normalized, namely, returned to a condition wherein the original phsyical properties of the synthetic resin coating are restored, and the exposed portions of it are again rendered non-wettable.

Having described the invention, what is claimed as new in support of Letters Patent is:

1. A method for making a metal core printed circuit board on a sheet of metal comprising etching the sheet in a caustic solution and chemically cleaning at least one metal surface, forming a coating on said metal surface while the sheet of metal is at substantially ambient temperature by applying a primer and while the sheet of metal is still at substantially ambient temperature applying successive films of synthetic plastic resin material while said resin is in a substantially liquid state, curing the successive films of coating in the course of their application, chemically treating the outermost surface of cured coating for a portion of its deth until a degraded surface film prevails thereon, depositing on said degraded surface film a catalytic amount of nobel metal until a sensitized degraded surface remains, subjecting said sensitized degraded surface to an application of electroless metal bath to form an uninterrupted conductive metal surface over said sensitized degraded surface, electroplating a conductor metal on said metal surface throughout the desired area of the board to the desired thickness, removing undesired metal to form a circuit pattern, then following the steps of electroplating and removal of undesired metal normalizing the surface of the outermost film when exposed together with the conductor metal by baking the coating at a temperature of about 350° F for a period of from 15 minutes to 1 hour until the exposed degraded surface film is in a normalized condition and retaining the metal of the circuit pattern at a level above the surface of the normalized surface.

2. The method of claim 1 wherein the electroless metal is nickel.

3. The method of claim 1 wherein the electroless metal is copper.

4. The method of claim 1 wherein the strike solution is copper and electroplating a layer of copper on the metal from the strike solution.

5. The method of claim 1 including applying a resist to the exposed metal surface and making a circuit pattern image on said resist to create respective cirucit line areas and intermediate areas.

6. The method of claim 1 including electroplating an unlike metal on said conductor metal to form an unlike metal surface before removal of said undesired metal.

7. The method of claim 6 wherein the unlike metal is tin-lead.

8. The method of claim 6 wherein the unlike metal is gold.

9. The method of claim 6 wherein the unlike metal is tin.

10. The method of claim 6 wherein the unlike metal is nickel.

11. The method of claim 6 wherein the unlike metal is rhodium.

12. The method of claim 1 including first forming holes through the sheet of metal and coating said holes with said film of synthetic plastic resin coating.

13. The method of claim 1 including coating opposite surfaces of said sheet with said synthetic plastic resin material and processing both of said surfaces whereby to create a complete printed circuit on both sides of said sheet.

14. The method of claim 13 including first forming holes through said sheet at locations where they will intersect circuit line areas when said circuit line areas are created, and extending material forming respectively said synthetic plastic resin and said metal films through the holes, applying the resist over the holes such that when undesired metal is removed to form one desired conductive pattern, the plated-through holes act to interconnect the patterns on both sides of the circuit board.

15. The method of claim 1 including the step of fabricating the sheet prior to the step of etching the same with a cauctic solution.

16. The method of claim 1 including making use of a polyurethane resin as the synthetic plastic resin.

17. The method of claim 1 wherein the resin is one selected from a group consisting of epoxy resin, polymide, diallylphthalates, polyesters polyurea, melamine-formaldehyde, phenol-formaldehyde and silicone resin.

18. The method of claim 1 including building up a primer and a plurality of not less than six successive layers of said synthetic plastic resin.

19. The method of claim 1 including using palladium chloride as the noble metal salt.

20. The method of claim 1 including mixing a filler of metal oxide with the synthetic plastic resin material and placing the filled resin material in contact respectively with the sheet of metal and the metal of the circuit pattern.

21. The method of claim 20 wherein the filler is an inorganic salt.

22. The method of claim 20 wherein the filler is an oxide selected from a group consisting of aluminum oxide and beryllium oxide.

* * * * *